(12) United States Patent
Choy (10) Patent No.: US 8,164,321 B2
(45) Date of Patent: Apr. 24, 2012

(54) CURRENT INJECTOR CIRCUIT FOR SUPPLYING A LOAD TRANSIENT IN AN INTEGRATED CIRCUIT

(75) Inventor: Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 233 days.

(21) Appl. No.: 12/720,304

(22) Filed: Mar. 9, 2010

(65) Prior Publication Data

US 2011/0221410 A1  Sep. 15, 2011

(51) Int. Cl.
*G05F 3/10* (2006.01)
*G05F 1/46* (2006.01)

(52) U.S. Cl. .................... 323/317; 323/312

(58) Field of Classification Search .............. 323/267, 323/283, 299, 312, 316, 317; 365/189.011, 365/189.09, 226; 327/538
See application file for complete search history.

(56) References Cited

U.S. PATENT DOCUMENTS

| | | | |
|---|---|---|---|
| 5,448,157 A * | 9/1995 | Saxon ........................... 323/312 |
| 5,629,608 A | 5/1997 | Budelman |
| 5,798,660 A * | 8/1998 | Cheng ............................. 327/65 |
| 6,469,942 B1 | 10/2002 | Kurihara |
| 6,525,972 B2 | 2/2003 | Yanagisawa |
| 7,102,440 B2 | 9/2006 | Damitio et al. |
| 7,489,566 B2 * | 2/2009 | Kang ....................... 365/189.11 |
| 7,525,853 B2 | 4/2009 | Kitazaki et al. |
| 7,616,456 B2 | 11/2009 | Ostrom et al. |
| 7,663,409 B2 * | 2/2010 | Singnurkar ................... 327/103 |

\* cited by examiner

*Primary Examiner* — Gary L Laxton
(74) *Attorney, Agent, or Firm* — Daniel D. Hill (57) ABSTRACT

A current injector circuit comprises a clock modulating circuit, a first current injector, a feedback circuit, a first input modulating circuit and a second current injector. The clock modulating circuit receives a clock, a control signal, and an output. The first current injector has an input coupled to the clock modulating circuit, and an output coupled to a power supply terminal for providing a first current. The feedback circuit is coupled between the power supply terminal and another input of the clock modulating circuit. The feedback circuit is for providing the control signal for controlling the clock modulating circuit. The first current injector provides the first current in response to the clock modulating circuit. The first input modulating circuit receives an input signal, the control signal, and an output. The second current injector has an input coupled to the first input modulating circuit, and an output for providing a second current.

20 Claims, 3 Drawing Sheets

CURRENT INJECTOR CIRCUIT FOR SUPPLYING A LOAD TRANSIENT IN AN INTEGRATED CIRCUIT

BACKGROUND

1. Field

This disclosure relates generally to integrated circuits, and more specifically, to a current injector circuit for supplying a load transient in an integrated circuit.

2. Related Art

To reduce power consumption, integrated circuits are being operated with lower power supply voltages. The use of lower supply voltages with increasing operating speeds can result in severe current load transients. Some conventional regulator circuits for detecting and supplying load transients have a feedback loop for detecting and responding to the transient. However, the feedback loop may be too slow to allow a timely response to the current transient. Also, a conventional regulator circuit may not be able to supply the needed current at a required voltage. Decoupling capacitors have also been used to supply the current required by a load transient. However, decoupling capacitors may have to be very large in order to supply the necessary current.

Therefore, what is needed is a current supply circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a regulated current injector including a master current injector circuit and a slave injector circuit. The slave injector includes a current injector and an input signal modulating circuit. The slave injector circuit provides a predetermined current to a load at a predetermined voltage level based a control signal provided by the master injector circuit. The master current injector is adjusted to provide the predetermined current and thereby cause the slave injector to provide the predetermined current, or some multiple thereof. The master injector circuit includes a current injector and a feedback circuit. The master current injector receives a free-running clock signal through a clock signal modulating circuit and provides a current into a supply voltage. A feedback circuit includes a voltage divider and a differential amplifier. The voltage divider is coupled to an output of the current injector and includes variable resistances. The differential amplifier compares a voltage from the voltage divider to a reference voltage, and provides a control signal to a clock modulating circuit based on the comparison. The control signal determines the amplitude of the clock signal to control the output current of the master current injector. As regulated, the control signal is provided to the input signal modulating circuit to control the amplitude of the input signal of the slave current injector. The input signal may be, for example, a read enable signal for a memory and the load that is supplied may be a word line. The input signal is provided to the slave current injector at the correct amplitude to supply the load with the predetermined current at the predetermined voltage level. The voltage level of the control signal can be adjusted by changing the resistance values of the variable resistances and/or by changing the voltage level of the reference voltage. The predetermined current for a word line, or any other load, can be calculated based on capacitance, line resistance, and voltage level. In one embodiment, the predetermined current is just enough to replace the charge that is lost when a word line is discharged.

The master current injector is continuously operating so that the slave current injector does not have to rely directly on a feedback circuit to set the predetermined current. Therefore, the regulated current injector can provide a predetermined current "on demand" to supply a load very quickly at a predetermined voltage level. Also, the predetermined current can be supplied accurately without the use of large decoupling capacitors. In addition, multiple slave current injectors can be coupled together in parallel to supply a larger current load. In one embodiment, the regulated current injector can be used to supply a large nearly instantaneous current for a very fast read access of a random access memory.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

In one aspect, there is provided, a current injector circuit comprising: a clock signal modulating circuit having a first input for receiving a clock signal, a second input for receiving a control signal, and an output; a first current injector having an input coupled to the output of the clock signal modulating circuit, and an output coupled to a power supply voltage terminal for providing a first predetermined current; a feedback circuit coupled between the power supply voltage terminal and a second input of the clock modulating circuit, the feedback circuit for providing the control signal for controlling the clock modulating circuit, and in response, the first current injector for providing the first predetermined current; a first input signal modulating circuit having a first input for receiving an input signal, a second input for receiving the control signal, and an output; and a second current injector having an input coupled to the output of the first input signal modulating circuit, and an output for providing a second predetermined current. The feedback circuit may comprise: a voltage divider coupled to the power supply voltage terminal; and a differential amplifier having a first input coupled to the voltage divider, a second input coupled to receive a reference voltage, and an output coupled to the second inputs of the both the clock signal modulating circuit and the first input signal modulating circuit. The voltage divider may comprise a first variable resistance and a second variable resistance, the first and second variable resistances coupled between the power supply voltage terminal and a second power supply voltage terminal. The current injector may further comprise: a second input signal modulating circuit having a first input for receiving the input signal, a second input for receiving the control signal, and an output coupled to the output of the first input signal modulating circuit; and a third current injector having an input coupled to the output of the second input signal modulating circuit, and an output coupled to the output of the first input signal modulating circuit, the second and third current injectors both providing the second predetermined current. The second predetermined current may be a multiple of the first predetermined current. The second current injector may comprise: a first transistor having a first current electrode coupled to the output of the second current injector, a control electrode, and a second current electrode; a second transistor having a first current electrode coupled to the second current electrode of the first transistor, a control electrode coupled to the control electrode of the first transistor, and second current electrode coupled to a second power supply voltage terminal; and a capacitor having a first plate electrode coupled to the second current electrode of the first transistor, and a second plate electrode coupled to the output of the first input signal modulating circuit. The first current injector may comprise: a first transistor having a first current electrode coupled to the output of the first current injector, a control electrode, and a second current electrode; a second transistor having a first current electrode coupled to the second current electrode of the first transistor, a control electrode coupled to the control electrode of the first transistor, and second current electrode coupled to a second power supply voltage terminal; and a capacitor having a first plate electrode coupled to the second current electrode of the first transistor, and a second plate electrode coupled to the output of the clock signal modulating circuit.

In another aspect, there is provided, a current injector circuit comprising: a differential amplifier having a first input terminal coupled to a first supply voltage terminal, a second input terminal coupled to receive a reference voltage, and an output terminal; a clock modulating circuit having a first input terminal coupled to the output terminal of the differential amplifier, a second input terminal coupled to receive a clock signal, and an output terminal; a master current injector having an input terminal coupled to the output terminal of the clock modulating circuit, and an output terminal coupled to the first supply voltage terminal; a first input modulating circuit having a first input terminal coupled to the output terminal of the differential amplifier, a second input terminal coupled to receive an input signal, and an output terminal; and a first slave current injector having an input terminal coupled to the output terminal of the first input modulating circuit, and an output terminal for supplying an output current. The first input terminal of the differential amplifier is coupled to the first supply voltage terminal through a voltage divider. The clock modulating circuit may comprise: a first transistor having a first current electrode coupled to a second power supply voltage terminal, a control electrode coupled to the output terminal of the differential amplifier, and a second current electrode; a second transistor having a first current electrode coupled to the second current electrode of the first transistor, a control electrode couple to receive the clock signal, and a second current electrode coupled to the input terminal of the master current injector; and a third transistor having a first current electrode coupled to the second current electrode of the second transistor, a control electrode coupled to receive the clock signal, and a second current electrode coupled to a third supply voltage terminal. The master current injector may comprise: a first transistor having a first current electrode coupled to the output of the master current injector, a control electrode, and a second current electrode; a second transistor having a first current electrode coupled to the second current electrode of the first transistor, a control electrode coupled to the control electrode of the first transistor, and second current electrode coupled to a second supply voltage terminal; and a capacitor having a first plate electrode coupled to the second current electrode of the first transistor, and a second plate electrode coupled to the output terminal of the clock signal modulating circuit. The first slave current injector may comprise: a first transistor having a first current electrode coupled to the output of the first slave current injector, a control electrode, and a second current electrode; a second transistor having a first current electrode coupled to the second current electrode of the first transistor, a control electrode coupled to the control electrode of the first transistor, and second current electrode coupled to a second supply voltage terminal; and a capacitor having a first plate electrode coupled to the second current electrode of the first transistor, and a second plate electrode coupled to the output terminal of the first input modulating circuit. The output terminal of the first slave current injector may be coupled to a word line of a memory. The current injector circuit may further comprise: a second input modulating circuit having a first input terminal coupled to the output terminal of the differential amplifier, a second input terminal coupled to receive the input signal, and an output terminal; and a second slave current injector having an input terminal coupled to the output terminal of the second input modulating circuit, and an output terminal for supplying the output current. The current injector circuit may be used in an analog-to-digital converter.

In yet another aspect, there is provided, a current injector circuit comprising: a clock signal modulating circuit having a first input for receiving a clock signal, a second input for receiving a control signal, and first and second outputs; a first current injector comprising: a first pair of cross-coupled inverters having first and second storage nodes, a power supply terminal for receiving a first power supply voltage, and an output terminal for providing a first predetermined current; a first capacitor having a first plate electrode coupled to the first storage node, and a second plate electrode coupled to the first output of the clock signal modulating circuit; and a second capacitor having a first plate electrode coupled to the second storage node, and a second plate electrode coupled to the second output of the clock signal modulating circuit; a feedback circuit coupled between the output terminal of the first pair of cross-coupled inverters and the second input of the clock signal modulating circuit, the feedback circuit providing the control signal for controlling the clock modulating circuit, and in response, the first current injector providing the first predetermined current; an input signal modulating circuit having a first input for receiving an input signal, a second input for receiving the control signal, and first and second outputs; and a second current injector comprising: a second pair of cross-coupled inverters having first and second storage nodes, a power supply terminal for receiving the first power supply voltage, and an output terminal for providing a second predetermined current; a third capacitor having a first plate electrode coupled to the first storage node of the second pair of cross-coupled inverters, and a second plate electrode coupled to the first output of the input signal modulating circuit; and a fourth capacitor having a first plate electrode coupled to the second storage node of the second pair of cross-coupled inverters, and a second plate electrode coupled to the second output of the input signal modulating circuit. The clock signal modulating circuit may comprise: a first transistor having a first current electrode coupled to receive the first power supply voltage, a control electrode coupled to receive the control signal, and a second current electrode; a second transistor having a first current electrode coupled to the second current electrode of the first transistor, a control electrode couple to receive the clock signal, and a second current electrode coupled to the second plate electrode of the first capacitor; and a third transistor having a first current electrode coupled to the second current electrode of the second transistor, a control electrode coupled to receive the clock signal, and a second current electrode coupled to receive a second power supply voltage. The feedback circuit may comprise: a voltage divider coupled to the output terminal of the first pair of cross-coupled inverters; and a differential amplifier having a first input coupled to the voltage divider, a second input coupled to receive a reference voltage, and an output coupled to the second inputs of the both the clock signal modulating circuit and the first input signal modulating circuit. The output terminal of the second pair of cross-coupled inverters may be coupled to a word line in a memory. The current injector circuit may be used in an analog-to-digital converter.

Figure 1:
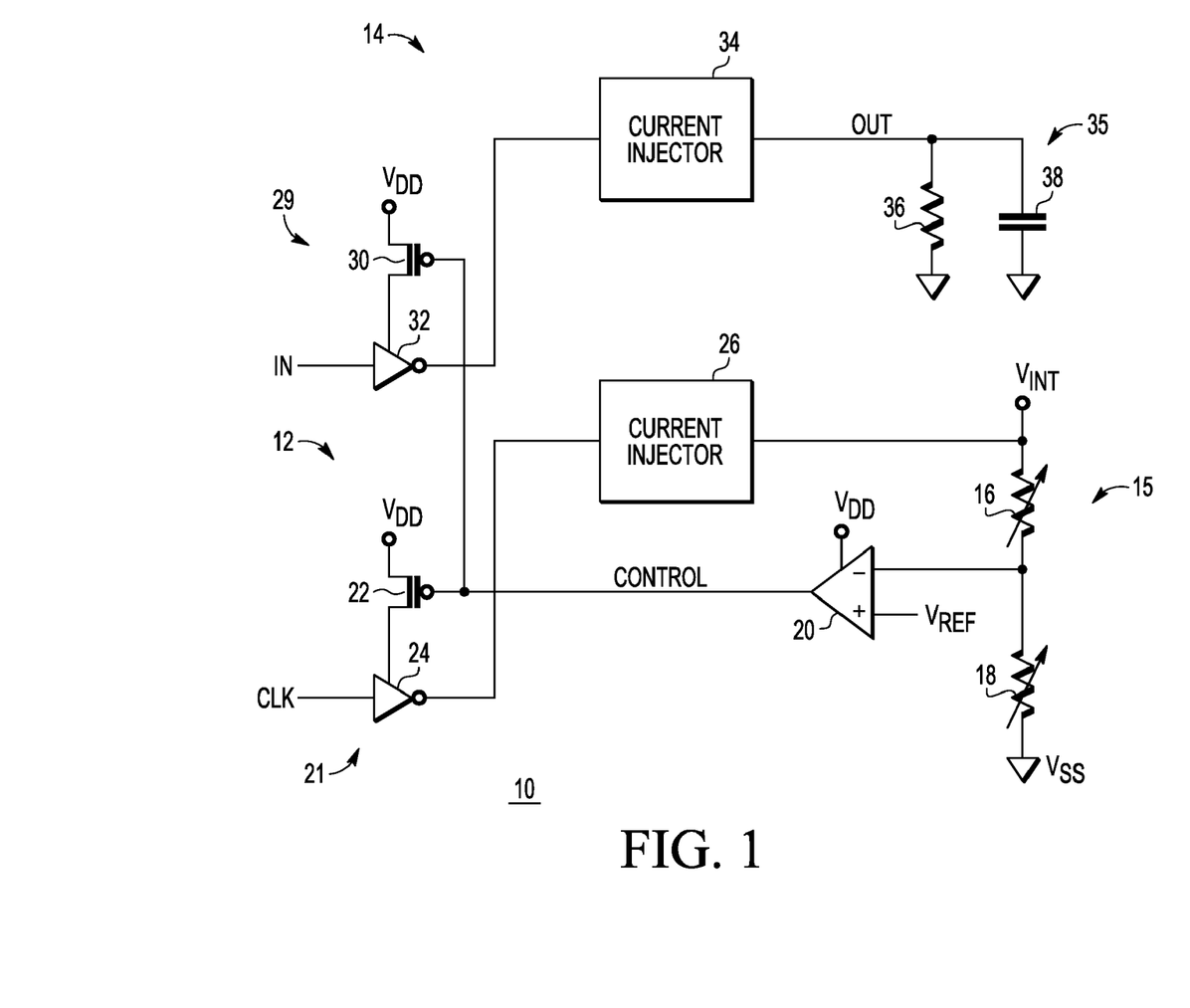
FIG. 1 illustrates, in partial block diagram form and partial schematic diagram form, a regulated current injector in accordance with an embodiment.

FIG. 1 illustrates, in partial block diagram form and partial schematic diagram form, a regulated current injector circuit 10 in accordance with an embodiment. In the illustrated embodiment, regulated current injector circuit 10 is implemented on an integrated circuit using a conventional complementary metal-oxide semiconductor (CMOS) processing technology. In other embodiments, regulated current circuit 10 may be formed in another way. Regulated current injector circuit 10 includes master current injector 12 and slave current injector 14. Master current injector 12 includes a voltage divider 15 comprising variable resistors 16 and 18, differential amplifier 20, a clock modulating circuit 21 comprising P-channel transistor 22 and inverter 24, and current injector 26. Slave current injector 14 includes an input signal modulating circuit 29 comprising P-channel transistor 30 and inverter 32, and current injector 34. Resistor 36 and capacitor 38 are representative of a resistive and/or capacitive load that is supplied by slave current injector 14.

Variable resistor 16 has a first terminal connected to a power supply voltage terminal labeled "VINT", and second terminal. Variable resistor 18 has a first terminal connected to the second terminal of resistor 16, and a second terminal connected to a power supply voltage terminal labeled "VSS". In one embodiment, power supply voltage VINT is an adjustable regulated power supply voltage and VSS is connected to ground. Differential amplifier 20 is a conventional analog type of comparator and has a negative input terminal connected to the second terminal of resistor 16, positive input for receiving a reference voltage labeled "VREF", and an output for providing a control signal labeled "CONTROL". In clock signal modulating circuit 21, P-channel transistor 22 has a first current electrode (source) connected to a power supply voltage terminal labeled "VDD", a control electrode (gate) connected to the output of differential amplifier 20, and a second current electrode (drain). In one embodiment, power supply voltage VDD is a positive power supply voltage, such as for example 3.3 volts. Voltage VINT may be derived from voltage VDD. Inverter 24 has an input for receiving free-running clock signal CLK, a control input connected to the second current electrode of transistor 22, and an output. Current injector 26 has an input connected to the output of inverter 24, and an output connected to power supply voltage terminal VINT.

In input signal modulating circuit 29, P-channel transistor 30 has a first current electrode connected to VDD, a control electrode connected to the output of differential amplifier 20, and a second current electrode. Inverter 32 has an input for receiving an input signal labeled "IN", and an output. Current injector 34 has an input connected to the output of inverter 32, and an output for supply a current OUT to a load 35. Load 35 is represented by resistor 36 and capacitor 38. In other embodiments, the load may be mostly resistive or mostly capacitive.

Regulated current injector circuit 10 may be used to supply a predetermined current to load 35 at a predetermined voltage level. A desired load current is determined, and master current injector 12 is configured to cause slave current injector 14 to provide the desired load current when an input signal IN is received. A current provided by current injector 26 of master current injector 12 can be adjusted by varying the resistance of variable resistors 16 and 18 of voltage divider 15, or by changing the voltage level of supply voltage VINT.

The operation of slave current injector 14 is controlled by master current injector 12. Voltage divider 15 and differential amplifier 20 provide a feedback circuit for controlling master current injector 12. During operation, voltage divider 15 provides a voltage to the negative input of differential amplifier 20. In another embodiment, a different circuit may be used instead of voltage divider 15 to provide the input voltage to differential amplifier 20. Differential amplifier 20 compares the voltage level at the negative input to a reference voltage provided at the positive input. An amplitude of the analog differential amplifier control signal CONTROL increases as the input voltage level increases, and decreases as the input voltage level decreases. If control signal CONTROL decreases, then either voltage VINT has decreased or the negative input voltage has changed as a result of varying the resistance of voltage divider 15. A decreasing amplitude of control signal CONTROL will cause P-channel transistor 22 to become more conductive, thus increasing the amplitude of clock signal CLK provided at the output of inverter 24. Current injector 26 receives the clock signal CLK. If the amplitude of clock signal CLK is increased, more charge is provided by current injector 26 to power supply voltage terminal VINT. Conversely, if power supply voltage VINT is high, then voltage divider 15 will provide a higher voltage to the negative input of differential amplifier 20, causing the voltage of control signal CONTROL to increase. A higher control signal voltage will cause P-channel transistor 22 to become less conductive, decreasing the amplitude of clock signal CLK. Current injector 26 will provide less current, causing the voltage at power supply voltage terminal VINT to decrease. In this way, the amplitude of control signal CONTROL will be maintained at a predetermined level. The voltage level of control signal CONTROL will control the conductivity of P-channel transistor 30. Slave current injector 14 is ready to provide a predetermined current to load 35 when input signal IN is received. The amount of the predetermined current provided by slave current injector 14 to load 35 is predetermined by adjusting master current injector 12. In another embodiment, additional slave current injectors may be added to supply more current.

Figure 2:
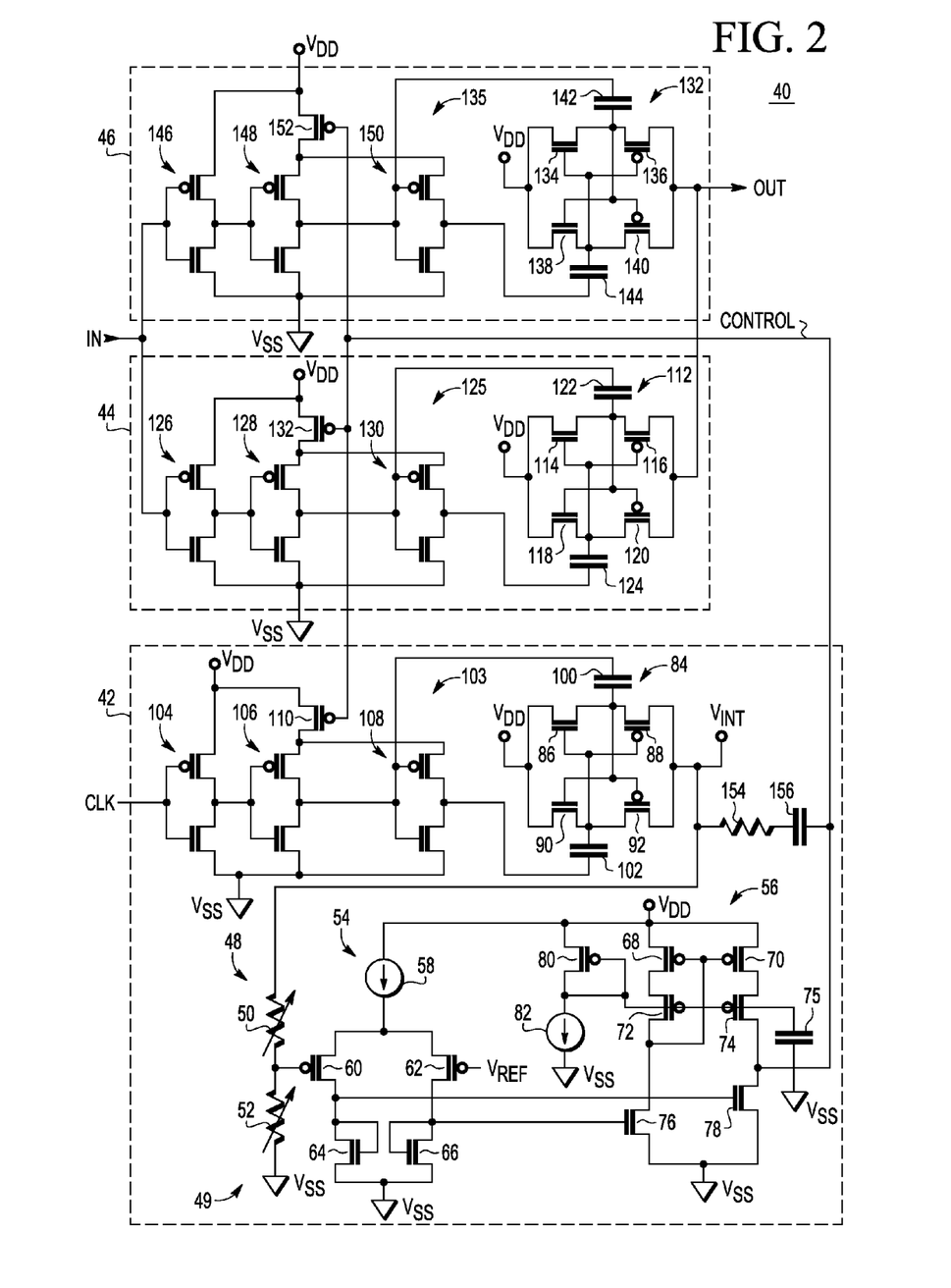
FIG. 2 illustrates, in schematic diagram form, a regulated current injector circuit in accordance with another embodiment.

FIG. 2 illustrates, in schematic diagram form, regulated current injector circuit 40 in accordance with another embodiment. Current injector 40 includes master current injector 42 and slave current injectors 44 and 46. Master current injector 42 includes voltage divider 48, differential amplifier 49, current injector 84, clock modulating circuit 103, resistor 154 and capacitor 156. Voltage divider 49 includes variable resistors 50 and 52. Differential amplifier 49 is a conventional analog comparator and includes first stage 54 and second stage 56. First stage 54 includes current source 58, P-channel transistors 60 and 62, and N-channel transistors 64 and 66 connected together to form a differential amplifier. Second stage 56 includes P-channel transistors 68, 70, 72, 74 and 80, N-channel transistors 76 and 68, current source 82, and capacitor 75. Note that in other embodiment, differential amplifier 49 may include more or fewer components. Current injector 84 includes P-channel transistors 88 and 92, N-channel transistors 86 and 90, and capacitors 100 and 102. Clock modulating circuit 103 includes inverters 104, 106, and 108, and P-channel transistor 110. Slave current injector 44 includes current injector 112 and input signal modulating circuit 125. Current injector 112 is similar to current injector 84 and includes P-channel transistors 116 and 120, N-channel transistors 114 and 118, and capacitors 122 and 124. Input signal modulating circuit 125 is similar to clock modulating circuit 103 and includes inverters 126, 128, and 130, and P-channel transistor 132. Slave current injector 46 includes current injector 132 and input signal modulating circuit 135. Current injector 132 includes P-channel transistors 136 and 140, N-channel transistors 134 and 138, and capacitors 142 and 144. Input signal modulating circuit 135 includes inverters 146, 148, and 150, and P-channel transistor 152. Current injector 135 is similar to current injector 112. In other embodiments, current injectors 84, 112, and 132 may be different.

In master current injector 42, differential amplifier 49 and voltage divider 48 form a feedback circuit from supply voltage VINT to provide a feedback signal labeled "CONTROL" to the gate of P-channel transistor 110 in clock modulating circuit 103. In current injector 84, P-channel transistor 88 has a first current electrode (source) connected to supply voltage terminal VINT, a control electrode (gate), and a second current electrode (drain). N-channel transistor 86 has a first current electrode (drain) connected to the second current electrode of transistor 88, a control electrode (gate) connected to the control electrode of transistor 88, and a second current electrode (source) connected to a power supply voltage terminal labeled "VDD". P-channel transistor 92 has a first current electrode connected to supply voltage terminal VINT, a control electrode connected to the second current electrode of transistor 88, and a second current electrode connected to the control electrodes of transistors 88 and 86. N-channel transistor 90 has a first current electrode connected to the second current electrode of transistor 92, a control electrode connected to the control electrode of transistor 92, and a second current electrode connected to VDD. Capacitor 100 has a first plate electrode connected to the second current electrode of transistor 88, and a second plate electrode connected to a first output of clock modulating circuit 103. Capacitor 102 has a first plate electrode connected to the second current electrode of transistor 92, and a second plate electrode connected to a second output of clock modulating circuit 103. Slave current injectors 44 and 46 each receive the same input signal IN. The outputs of slave current injectors 44 and 46 are connected together to provide output signal OUT. In the illustrated embodiment, input signal IN is not a periodic clock signal, but is provided asynchronously to supply a load very quickly. In one embodiment, input signal IN is a control signal in a data processing system. In another embodiment, input signal IN is a read enable signal in a memory, such as for example, a non-volatile memory (NVM). In another embodiment, the memory can be another memory type, such as for example, a static random access memory (SRAM).

In clock modulating circuit 103, inverters 104, 106, and 108 are connected in series. Inverter 104 has an input for receiving a free-running clock signal CLK at a known frequency, and supply terminals coupled to VDD and VSS. P-channel transistor 110 is connected to VDD and to inverters 106 and 108 and controls the propagation of the clock signal through series-connected inverters 104, 106, and 108. The output of inverter 106 is connected to the second plate electrode of capacitor 100 and to the input of inverter 108. Inverters 106 and 108 are also connected to VSS. The output of inverter 108 is connected to the second plate electrode of capacitor 102. Capacitors 100 and 102 are charged and discharged on alternate cycles of clock signal CLK to provide charge to supply voltage terminal VINT. In one embodiment, the VINT is a regulated voltage based on VDD. The feedback circuit comprising voltage divider 48 and differential amplifier 49. The feedback circuit controls the amount of charge provided to VINT by current injector 84 by controlling the conductivity of P-channel transistor 110. In one embodiment, supply voltage VINT is boosted above the voltage level of power supply voltage VDD.

To control the conductivity of P-channel transistor 110, supply voltage VINT is provided to voltage divider 48. Voltage divider 48 includes variable resistors 50 and 52 connected in series between VINT and power supply voltage terminal VSS. In the illustrated embodiment, VSS is connected to ground. A predetermined voltage is provided to a control electrode of P-channel transistor 60 of first stage 54. Differential amplifier 49 functions as an analog comparator. That is, the voltage provided to the gate of transistor 60 is compared to a reference voltage labeled "VREF". More or less current is steered through transistors 60 depending on whether VREF is higher or lower than the voltage at the gate of transistor 60. A voltage drop across diode-connected N-channel transistors 64 and 66 determines an output voltage of first stage 54. The voltage can be changed by changing the resistance values of one or both of variable resistors 50 and 52. In one embodiment, resistors 50 and 52 comprise a network of resistors. N-channel transistors 76 and 78 of second stage 56 receive the output voltages of first stage 54 at the gates of N-channel transistors 76 and 78. As a result, an output voltage of second stage 56 is provided to the gate of P-channel transistor 110 to control the conductivity of transistor 110. If the voltage at the gate of transistor 60 is higher than VREF, then more current is steered through transistor 60 and the voltage at the gate of transistor 78 is higher, causing transistor 78 to become less conductive, thereby raising the voltage of control signal CONTROL at the gate of transistor 110. The amplitude of the clock signal provided to current injector 84 is lower, thus reducing the amount of charge provided to VINT. On the other hand, if the voltage at the gate of transistor 60 is lower than VREF, then more current is steered through transistor 60 and the voltage at the gate of transistor 78 is increased. Transistor 78 becomes more conductive, reducing the voltage of control signal CONTROL at the gate of transistor 110. Transistor 110 becomes more conductive, causing the amplitude of the clock signal provided to current injector 84 to be higher, thus increasing the amount of charge provided to VINT. In this manner, VINT is regulated to a predetermined voltage level. As can be seen in FIG. 2, slave current injectors 44 and 46 receive the same control signal CONTROL as P-channel transistor 110. When input signal IN is provided to input signal modulating circuits 125 and 135, slave current injectors 44 and 46 provide output voltage OUT with a nearly instantaneous current at a predetermined voltage. In one embodiment, this makes it possible to drive a word line voltage high very quickly during a memory read access. Note than in another embodiment of FIG. 2, there may be only one slave current injector or more than two. Also, in another embodiment, the disclosed current injector circuits may be used in another type of circuit, such as for example, an analog-to-digital converter.

Figure 3:
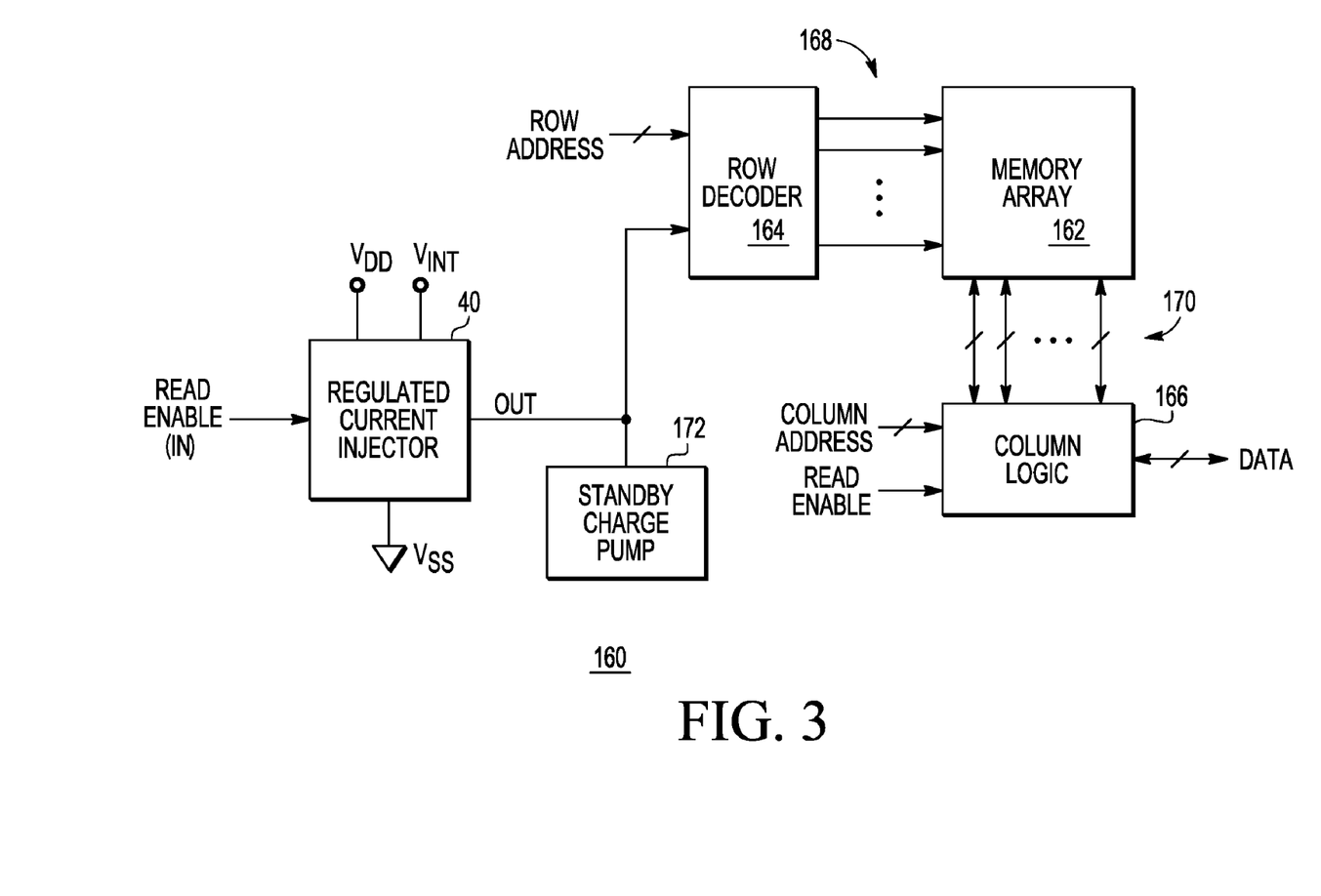
FIG. 3 illustrates a simplified block diagram of a memory having the regulated current injector circuit of FIG. 2.

FIG. 3 illustrates a simplified block diagram of memory 160 having regulated current injector circuit 40 of FIG. 2.

Memory 160 includes memory array 162, row decoder 164, column logic 166, regulated current injector 40 (FIG. 2), and standby charge pump 172. Memory array 162 includes a plurality of random access memory cells, such as for example, a plurality of NVM cells. Row decoder 164 includes decoding and predecoding circuits, and write drivers for accessing a row of memory cells via word lines 168. Column logic 166 includes column decoders, predecoders, sense amplifiers, bit line loads, and other input/output circuits for accessing bits during read and write operations via data lines 170. Standby charge pump 172 has an output connected to row decoder 164.

Generally, memory 160 operates similarly to conventional random access memories. During a read or a write operation, an address comprising a row address (ROW ADDRESS) and a column address (COLUMN ADDRESS) is provided to row decoders 164 and column logic 166, respectively. The address selects a particular location in memory array 162 by enabling a word line and a bit line, or bit line pair, depending on the memory. If the access is a write access, a read enable signal (READ ENABLE) is negated as a logic low voltage, data (DATA) is provided to column logic to write to the selected location via data lines 170 and bit lines in the memory array. If the access is a read access, the read enable signal (READ ENABLE) is asserted as a logic high voltage. The read enable signal READ ENABLE is also provided to current injector 40. In one embodiment, standby charge pump 172 provides the boosted word line voltage (OUT) during a memory access. Current injector 40 is provided to supplement the operation of standby charge pump 172 when more current is needed to raise the word line very quickly, or when there is a load transient. Note that the read enable signal READ ENABLE corresponds to the input signal IN as illustrated in FIG. 2. The output signal OUT of current injector 40 is coupled to the selected word line in memory array 162 and the voltage on the selected word line is increased very quickly due to the relatively high current output of current injector 40 as described above in the discussion of FIG. 2. Data is then read out of the selected location through data lines 170 and column logic 166 as data bits DATA.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A current injector circuit comprising:
   a clock signal modulating circuit having a first input for receiving a clock signal, a second input for receiving a control signal, and an output;
   a first current injector having an input coupled to the output of the clock signal modulating circuit, and an output coupled to a power supply voltage terminal for providing a first predetermined current;
   a feedback circuit coupled between the power supply voltage terminal and a second input of the clock modulating circuit, the feedback circuit for providing the control signal for controlling the clock modulating circuit, and in response, the first current injector for providing the first predetermined current;
   a first input signal modulating circuit having a first input for receiving an input signal, a second input for receiving the control signal, and an output; and
   a second current injector having an input coupled to the output of the first input signal modulating circuit, and an output for providing a second predetermined current.

2. The current injector circuit of claim 1, wherein the feedback circuit comprises:
   a voltage divider coupled to the power supply voltage terminal; and
   a differential amplifier having a first input coupled to the voltage divider, a second input coupled to receive a reference voltage, and an output coupled to the second inputs of the both the clock signal modulating circuit and the first input signal modulating circuit.

3. The current injector circuit of claim 2, wherein the voltage divider comprises a first variable resistance and a second variable resistance, the first and second variable resistances coupled between the power supply voltage terminal and a second power supply voltage terminal.

4. The current injector circuit of claim 1, further comprising:
   a second input signal modulating circuit having a first input for receiving the input signal, a second input for receiving the control signal, and an output coupled to the output of the first input signal modulating circuit; and
   a third current injector having an input coupled to the output of the second input signal modulating circuit, and an output coupled to the output of the first input signal modulating circuit, the second and third current injectors both providing the second predetermined current.

5. The current injector circuit of claim 1, wherein the second predetermined current is a multiple of the first predetermined current.

6. The current injector circuit of claim 1, wherein the second current injector comprises:
   a first transistor having a first current electrode coupled to the output of the second current injector, a control electrode, and a second current electrode;

a second transistor having a first current electrode coupled to the second current electrode of the first transistor, a control electrode coupled to the control electrode of the first transistor, and second current electrode coupled to a second power supply voltage terminal; and a capacitor having a first plate electrode coupled to the second current electrode of the first transistor, and a second plate electrode coupled to the output of the first input signal modulating circuit.

7. The current injector circuit of claim 1, wherein the first current injector comprises:

a first transistor having a first current electrode coupled to the output of the first current injector, a control electrode, and a second current electrode;

a second transistor having a first current electrode coupled to the second current electrode of the first transistor, a control electrode coupled to the control electrode of the first transistor, and second current electrode coupled to a second power supply voltage terminal; and a capacitor having a first plate electrode coupled to the second current electrode of the first transistor, and a second plate electrode coupled to the output of the clock signal modulating circuit.

8. A current injector circuit comprising:

a differential amplifier having a first input terminal coupled to a first supply voltage terminal, a second input terminal coupled to receive a reference voltage, and an output terminal;

a clock modulating circuit having a first input terminal coupled to the output terminal of the differential amplifier, a second input terminal coupled to receive a clock signal, and an output terminal;

a master current injector having an input terminal coupled to the output terminal of the clock modulating circuit, and an output terminal coupled to the first supply voltage terminal;

a first input modulating circuit having a first input terminal coupled to the output terminal of the differential amplifier, a second input terminal coupled to receive an input signal, and an output terminal; and a first slave current injector having an input terminal coupled to the output terminal of the first input modulating circuit, and an output terminal for supplying an output current.

9. The current injector circuit of claim 8, wherein the first input terminal of the differential amplifier is coupled to the first supply voltage terminal through a voltage divider.

10. The current injector circuit of claim 8, wherein the clock modulating circuit comprises:

a first transistor having a first current electrode coupled to a second power supply voltage terminal, a control electrode coupled to the output terminal of the differential amplifier, and a second current electrode;

a second transistor having a first current electrode coupled to the second current electrode of the first transistor, a control electrode couple to receive the clock signal, and a second current electrode coupled to the input terminal of the master current injector; and a third transistor having a first current electrode coupled to the second current electrode of the second transistor, a control electrode coupled to receive the clock signal, and a second current electrode coupled to a third supply voltage terminal.

11. The current injector circuit of claim 8, wherein the master current injector comprises:

a first transistor having a first current electrode coupled to the output of the master current injector, a control electrode, and a second current electrode;

a second transistor having a first current electrode coupled to the second current electrode of the first transistor, a control electrode coupled to the control electrode of the first transistor, and second current electrode coupled to a second supply voltage terminal; and a capacitor having a first plate electrode coupled to the second current electrode of the first transistor, and a second plate electrode coupled to the output terminal of the clock signal modulating circuit.

12. The current injector circuit of claim 8, wherein the first slave current injector comprises:

a first transistor having a first current electrode coupled to the output of the first slave current injector, a control electrode, and a second current electrode;

a second transistor having a first current electrode coupled to the second current electrode of the first transistor, a control electrode coupled to the control electrode of the first transistor, and second current electrode coupled to a second supply voltage terminal; and a capacitor having a first plate electrode coupled to the second current electrode of the first transistor, and a second plate electrode coupled to the output terminal of the first input modulating circuit.

13. The current injector circuit of claim 8, wherein the output terminal of the first slave current injector is coupled to a word line of a memory.

14. The current injector circuit of claim 8, further comprising:

a second input modulating circuit having a first input terminal coupled to the output terminal of the differential amplifier, a second input terminal coupled to receive the input signal, and an output terminal; and a second slave current injector having an input terminal coupled to the output terminal of the second input modulating circuit, and an output terminal for supplying the output current.

15. The current injector circuit of claim 8, wherein the current injector circuit is used in an analog-to-digital converter.

16. A current injector circuit comprising:

a clock signal modulating circuit having a first input for receiving a clock signal, a second input for receiving a control signal, and first and second outputs;

a first current injector comprising:

a first pair of cross-coupled inverters having first and second storage nodes, a power supply terminal for receiving a first power supply voltage, and an output terminal for providing a first predetermined current;

a first capacitor having a first plate electrode coupled to the first storage node, and a second plate electrode coupled to the first output of the clock signal modulating circuit; and a second capacitor having a first plate electrode coupled to the second storage node, and a second plate electrode coupled to the second output of the clock signal modulating circuit;

a feedback circuit coupled between the output terminal of the first pair of cross-coupled inverters and the second input of the clock signal modulating circuit, the feedback circuit providing the control signal for controlling the clock modulating circuit, and in response, the first current injector providing the first predetermined current;

an input signal modulating circuit having a first input for receiving an input signal, a second input for receiving the control signal, and first and second outputs; and a second current injector comprising:
- a second pair of cross-coupled inverters having first and second storage nodes, a power supply terminal for receiving the first power supply voltage, and an output terminal for providing a second predetermined current;
- a third capacitor having a first plate electrode coupled to the first storage node of the second pair of cross-coupled inverters, and a second plate electrode coupled to the first output of the input signal modulating circuit; and
- a fourth capacitor having a first plate electrode coupled to the second storage node of the second pair of cross-coupled inverters, and a second plate electrode coupled to the second output of the input signal modulating circuit.

17. The current injector of claim 16, wherein the clock signal modulating circuit comprises:
- a first transistor having a first current electrode coupled to receive the first power supply voltage, a control electrode coupled to receive the control signal, and a second current electrode;
- a second transistor having a first current electrode coupled to the second current electrode of the first transistor, a control electrode couple to receive the clock signal, and a second current electrode coupled to the second plate electrode of the first capacitor; and
- a third transistor having a first current electrode coupled to the second current electrode of the second transistor, a control electrode coupled to receive the clock signal, and a second current electrode coupled to receive a second power supply voltage.

18. The current injector circuit of claim 16, wherein the feedback circuit comprises:
- a voltage divider coupled to the output terminal of the first pair of cross-coupled inverters; and
- a differential amplifier having a first input coupled to the voltage divider, a second input coupled to receive a reference voltage, and an output coupled to the second inputs of the both the clock signal modulating circuit and the first input signal modulating circuit.

19. The current injector circuit of claim 16, wherein the output terminal of the second pair of cross-coupled inverters is coupled to a word line in a memory.

20. The current injector circuit of claim 16, wherein the regulated current injector circuit is used in an analog-to-digital converter.

* * * * *